United States Patent [19]

Taneda et al.

[11] Patent Number: 5,190,894

[45] Date of Patent: Mar. 2, 1993

[54] METHOD OF FORMING A WIRING LAYER OF A SEMICONDUCTOR DEVICE

[75] Inventors: Hirohito Taneda; Masataka Takebuchi, both of Yokohama, Japan

[73] Assignee: Kabushiki Kaisha Toshiba, Kawasaki, Japan

[21] Appl. No.: 689,706

[22] Filed: Apr. 19, 1991

[30] Foreign Application Priority Data

Apr. 20, 1990 [JP] Japan ................................ 2-104566

[51] Int. Cl.⁵ ............................................ H01L 21/31
[52] U.S. Cl. ............................... 437/195; 437/187; 437/228; 437/229; 437/962; 148/DIG. 106; 430/318
[58] Field of Search ............... 437/195, 228, 229, 187, 437/194, 962; 148/DIG. 106; 156/659.1, 660; 430/311, 318

[56] References Cited

U.S. PATENT DOCUMENTS

| | | | |
|---|---|---|---|
| 4,557,797 | 12/1985 | Fuller et al. | 156/643 |
| 5,057,462 | 10/1991 | Eisenberg et al. | 437/229 |
| 5,126,289 | 6/1992 | Ziger | 437/231 |
| 5,135,891 | 8/1992 | Ikeno et al. | 437/228 |

*Primary Examiner*—T. N. Quach
*Attorney, Agent, or Firm*—Finnegan, Henderson, Farabow, Garrett and Dunner

[57] ABSTRACT

In a method of manufacturing a semiconductor device, an Al wiring layer is formed on an interlevel insulator using a positive resist. The interlevel insulator has a recess portion formed on its surface corresponding to a position between two electrodes under the interlevel insulator. The Al wiring layer extends along the recess portion in the longitudinal direction and is formed to bridge the recess portion in a direction perpendicular to the logitudinal direction. The method includes the steps of arranging an Al layer on a region of the interlevel insulator including the recess portion, arranging the resist of the Al layer, exposing the resist to a light beam using a mask member having a light-shielding portion corresponding to the wiring layer, patterning the photoresist, and etching the Al layer using the patterned resist as a mask to form the wiring layer. The light-shielding portion of the mask member is sized such that both sides of the Al wiring layer are located at locations where a surface of the interlevel insulator is perpendicular to the radiation direction of the light beam.

10 Claims, 6 Drawing Sheets

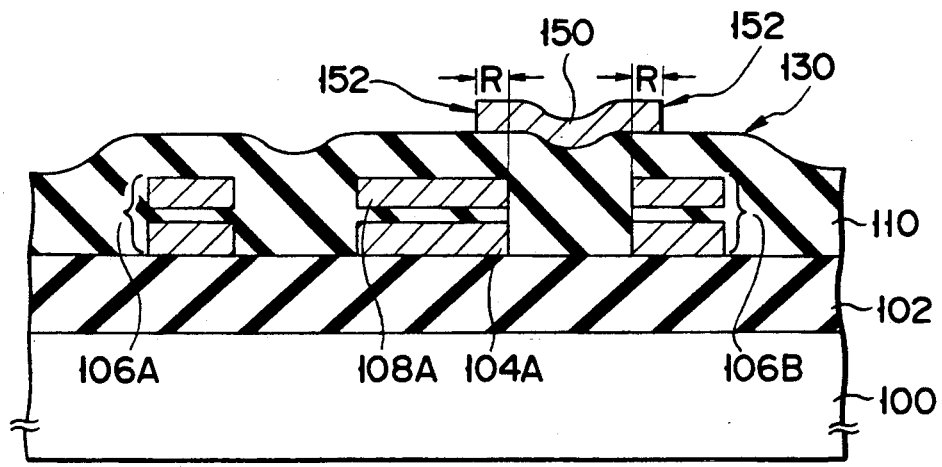
F I G. 2
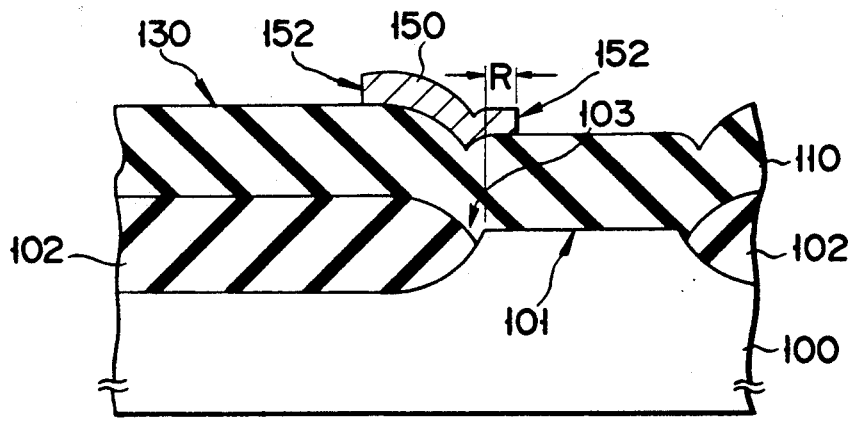
F I G. 3

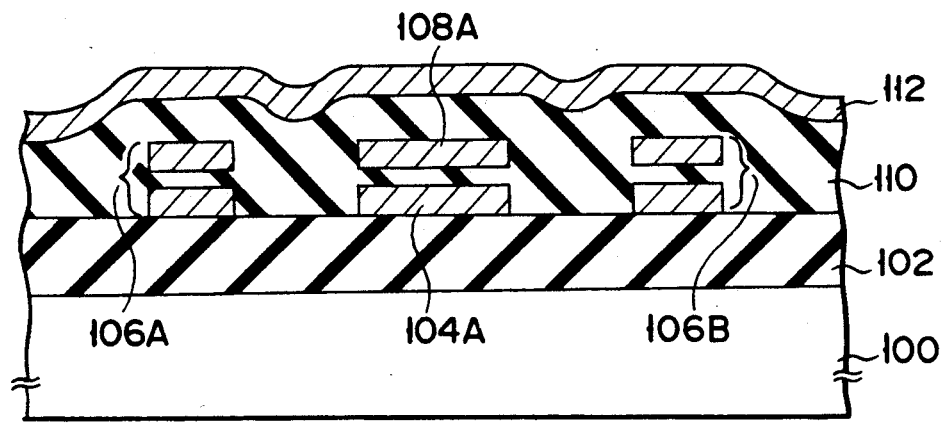
F I G. 4A
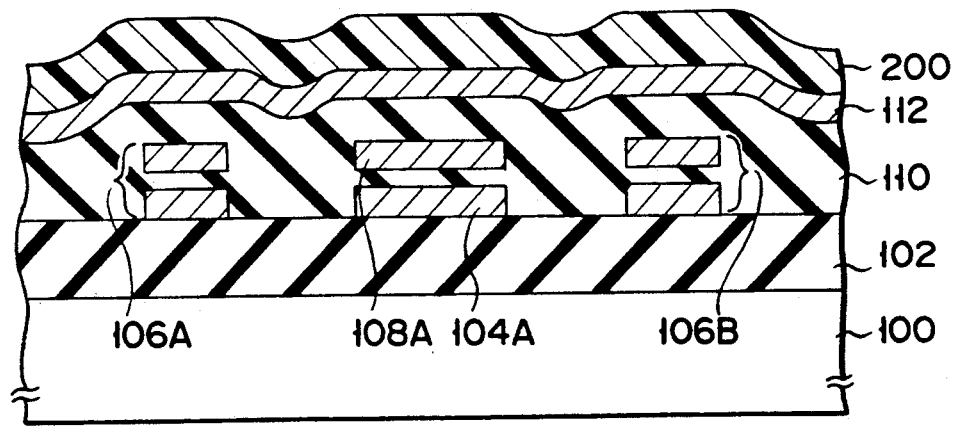
F I G. 4B

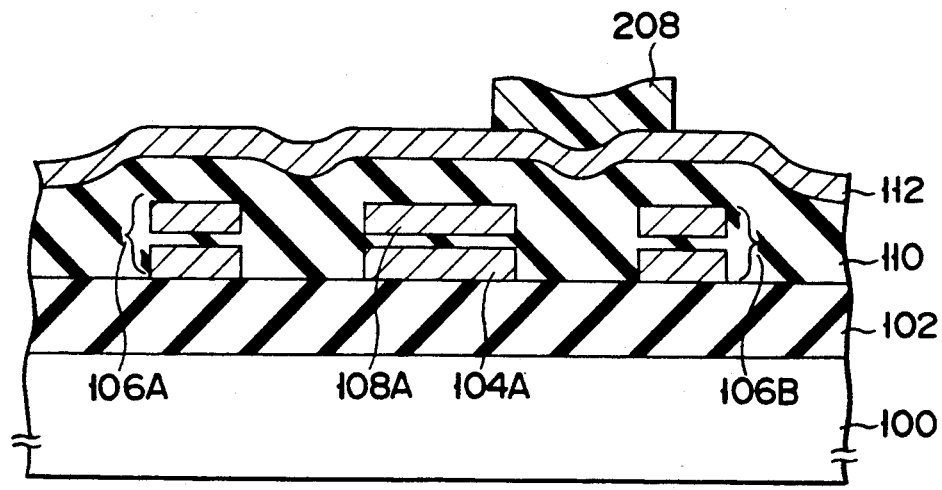
F I G. 4E
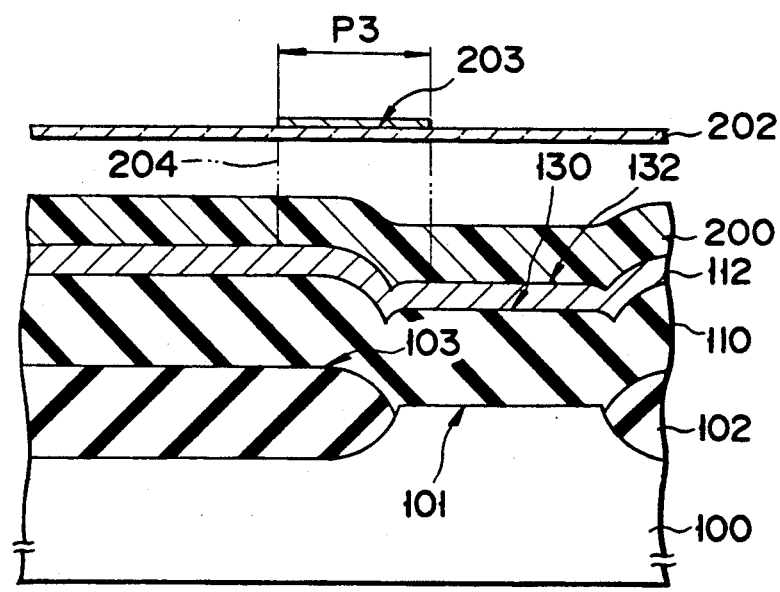
F I G. 5A

METHOD OF FORMING A WIRING LAYER OF A SEMICONDUCTOR DEVICE

BACKGROUND OF THE INVENTION

1. Field of the Invention

The present invention relates to a method of manufacturing a semiconductor device and, more particularly, to a method of forming a wiring layer on the surface of an interlevel insulator in a semiconductor device having a step portion on the surface of the interlevel insulator. In this case, the step portion is formed between a plurality of electrodes arranged under the interlevel insulator and/or between lower wiring layers or an interface between an element region and an element isolation region.

2. Description of the Related Art

In a semiconductor device, inclined portions, recess portions, and/or projecting portions are formed on the surface of an interlevel insulator by an electrode and a lower wiring layer. In these portions, a wiring layer having a width smaller than that of a wiring layer to be formed is formed. This is known as a problem so called "narrowing of wiring".

This narrowing of wiring occurs not only on an electrode and a lower wiring layer but near an interface portion between the element region and the element isolation region. In this case, a wiring layer having a width smaller than that of a wiring layer to be formed is formed.

When the wiring layer is to be formed on a surface of the interlevel insulator, an Al layer serving as a wiring layer is formed on the entire surface of the interlevel insulator. In this case, the Al layer has an uneven surface conforming with an uneven shape of the surface of the interlevel insulator. Thereafter, a resist is formed on the Al film, and the resist is exposed by a beam so as to be patterned. Sequentially, the Al layer is patterned using the patterned resist as a mask, thereby forming the wiring layer.

In the above process, when a positive resist (i.e., a type for removing an exposed portion) is used, a beam reflected by the inclined side of the uneven surface of the Al layer is received by the resist to narrow the resist. For this reason, the wiring layer is narrowed due to the narrowing of the resist.

When the wiring layer having the narrow portion is used, a wiring layer is easily discontinued upon forming of a surface protection film (not shown), thereby decreasing a yield of products. In addition, in this case, even when the wiring layer is not discontinued, the narrow portion of the wiring layer is easily degraded after the products are shipped, and the reliability of the wiring may be degraded, thereby degrading the device itself.

As described above, in the conventional semiconductor device, a wiring layer pattern is formed regardless of the presence of a step portion included in the underlaying film of a metal layer serving as a wiring layer. As a result, narrowing of wiring is caused, thereby decreasing a yield of products and degrading the reliability of the device.

SUMMARY OF THE INVENTION

The present invention has been made in consideration of the above problem, and has as its object to provide a method of manufacturing a semiconductor device having a wiring layer formed to cover a step portion at a high yield without narrowing the wiring layer.

According to the present invention, there is provided a method of manufacturing a semiconductor device in which a metal wiring layer is formed by a positive photoresist on an interlevel insulator having a step portion on its surface, the metal wiring layer extending along the step portion in a longitudinal direction thereof and being formed across the step portion in a direction perpendicular to the longitudinal direction, and the method comprising the steps of, arranging a metal layer on a region on the interlevel insulator including the step portion, arranging the resist on the metal layer, exposing the resist to a light beam using mask means having a light-shielding portion corresponding to the wiring layer to pattern the resist, and etching the metal layer using the patterned resist as a mask, wherein the light-shielding portion of the mask means is sized such that both sides of the metal wiring layer are located at locations where an upper surface of the interlevel insulator is perpendicular to the radiation direction of the light beam.

The step portion is formed by an electrode, a lower wiring layer or an interface portion between an element region and an element isolation region under the interlevel insulator. When two electrodes and/or lower wiring layers are located under the interlevel insulator, the step portion is to be a part of the recess portion of the surface of the interlevel insulator formed with respect to the positions of the two electrodes and/or lower wiring layers. In general, the wiring layer is made of aluminum.

In a semiconductor device manufactured in the above method, even when a part of light transmitting through the resist is reflected by the inclined surface of the metal layer, an adverse effect to the accuracy of an exposure size of the resist can be extremely restrained. Therefore, the pattern of a light-shielding portion illustrated on the mask member can be exactly reproduced on the resist.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a sectional view showing the semiconductor device along a line II—II in FIG. 1;

FIG. 3 is a sectional view showing the semiconductor device along a line III—III in FIG. 1;

FIGS. 4A to 4E are sectional views showing the semiconductor device in an order of manufacturing steps in correspondence with the sectional view of FIG. 2; and FIGS. 5A to 5C are sectional views showing the semiconductor device in an order of manufacturing steps in correspondence with the sectional view of FIG. 3.

DETAILED DESCRIPTION OF THE PREFERRED EMBODIMENTS

An embodiment of the present invention will be described below with reference to the accompanying drawings.

In this embodiment, memory cells of an EEPROM are exemplified.

Figure 1:
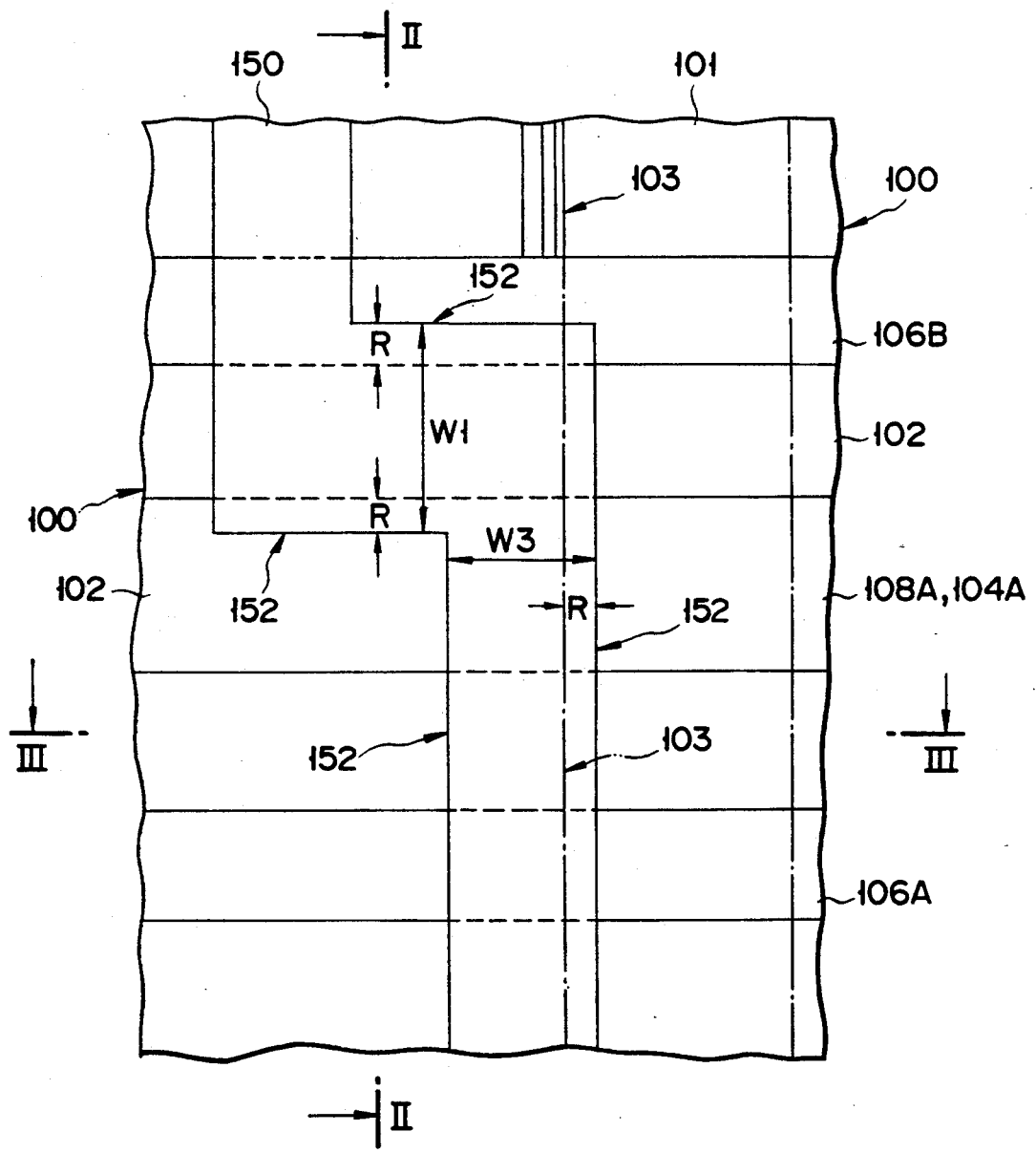
FIG. 1 is a plan view showing a semiconductor device according to the first embodiment of the present invention.

As shown in FIGS. 1 to 3, each of memory cells of an EEPROM comprises a silicon substrate 100 having an element region 101 and an element isolation region 102 on its major surface, a floating gate 104A formed on the substrate 100, a control gate 108A formed above the floating gate 104A to be capacitive-coupled through an insulating film, a multilayered selective gate 106A and a multilayered read gate 106B formed on both the sides of the resultant structure to be separated from each other, and the like. An interlevel insulator 110 for electrically isolating these various gates from each other is formed on the entire surface of the resultant structure. A wiring layer 150 constituting a column selecting line or the like is formed on the interlevel insulator 110.

In the memory cell with the above arrangement, a wiring layer 150 is arranged to be bent (in FIG. 1) on a part between the read gate 106B and the control gate 108A due to, e.g., the limitation of a wiring pattern or the like. In addition, the wiring layer 150 is arranged along an interface portion 103 between the element region 101 and the element isolation region 102. Note that the portion between the read gate 106B and the control gate 108A and the interface section 103 are step portions in which the upper face 130 of the interlevel insulator is inclined with respect to the major surface of the substrate 100.

When a wiring layer is formed to partially cover the step portion, each of the sides 152 of the wiring layer 150 extending parallelly to the step portion reaches to a region where a portion of the upper surface 130 is almost parallel to the major surface of the substrate 100. As the almost parallel region, a region covering the control gate 108a or the read gate 106B is preferably selected in the case of the portion between the read gate 106B and the control gate 108A. On the interface portion 103, a region partially covering the element region 101 is preferable selected as the parallel region.

Each of the control gate 108A and the gate 106B has a certain width so that the upper surface 130 is expected to be plane or almost parallel to the substrate 100 in each region. The region on the element region 101 is located on the major surface of the substrate 100, and the upper surface 130 is plane or parallel to the major surface of the substrate 100.

In this embodiment, each of the sides 152 extending parallelly to the step portion of the wiring layer 150 is arranged on the plane region of the upper surface 130. A portion R overlapping each gate and a element region is formed in the wiring layer 150. A width W1 of the wiring layer 150 on the portion between the read gate 106B and the control gate 108A includes the portion R overlapping the control gate 108A and the read gate 106B. Similarly, a width W3 of the wiring layer 150 on the interface portion 103 includes the portion R overlapping the element region A method of manufacturing a memory cell according to the above embodiment w 11 be described below with reference to FIGS. 4A to 4E and 5A to 5C.

As shown in FIG. 4A, the element isolation region 102 is formed on the major surface of the silicon substrate 100 by a conventional element isolation technique, and then the floating gate 104A, the control gate 108A, the selecting gate 106A, and the read gate 106B are formed by a conventional manufacturing method. The interlevel insulator 110 is formed o the entire surface of the resultant structure, and an Al layer 112 serving as a wiring layer is formed on the entire surface.

As shown in FIG. 4B, a positive photoresist 200 is coated on the Al layer 112.

Figure 4C:
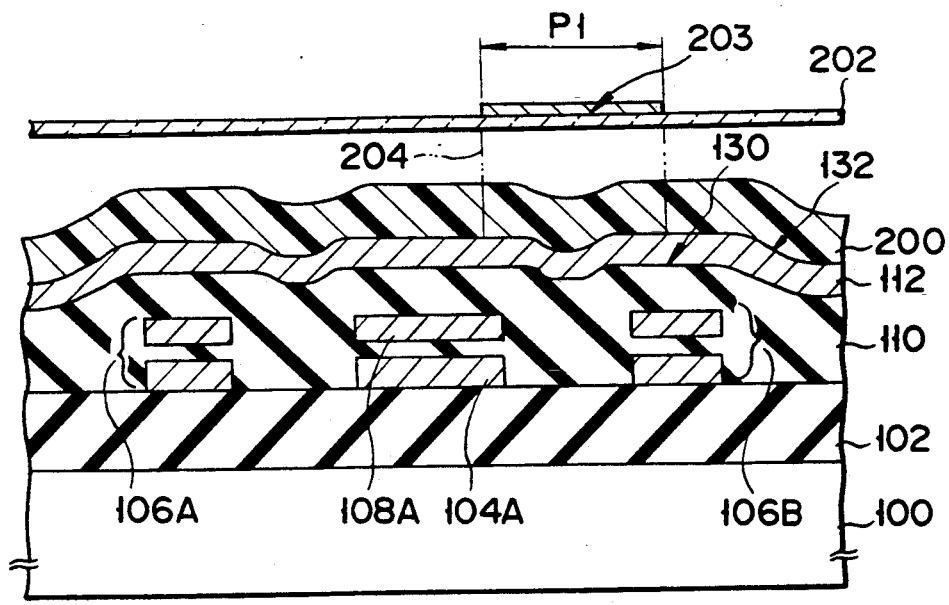

As shown in FIGS. 4C and 5A, the photoresist 200 is exposed except for a portion under a light-shielding portion 203 by emitting an ultraviolet beam 204 using a mask member 202 having the light-shielding portion 203 of widths P1 and P3.

The light-shielding portion 203 has a predetermined wiring pattern including the wiring layer 150 shown in FIGS. 1 and 3. The wiring pattern is bent on the read gate 106B and the control gate 108A, bent again on the interface portion 103, and extends along the interface portion 103.

The width P1 of the light-shielding portion 203 shown in FIG. 4C corresponds to the width W1 of the wiring 150 including the overlapping portion R shown in FIGS. 1 and 2. Similarly, the width P3 in FIG. 5A corresponds to the width W3 including the overlapping portion R in FIGS. 1 and 3.

In this case, the interlevel insulator 110 conventionally has step portions between gates and on the interface portion. However, as described above, each of the sides extending parallelly to the step portion of the wiring layer reaches to a region where the upper surface 130 of the interlevel insulator 110 on the gate or the element region is almost parallel to the major surface of the substrate 100, i.e., where the upper surface 130 is perpendicular to the radiation direction of the exposing light beam 204, thereby forming a wiring pattern.

Figure 4D:
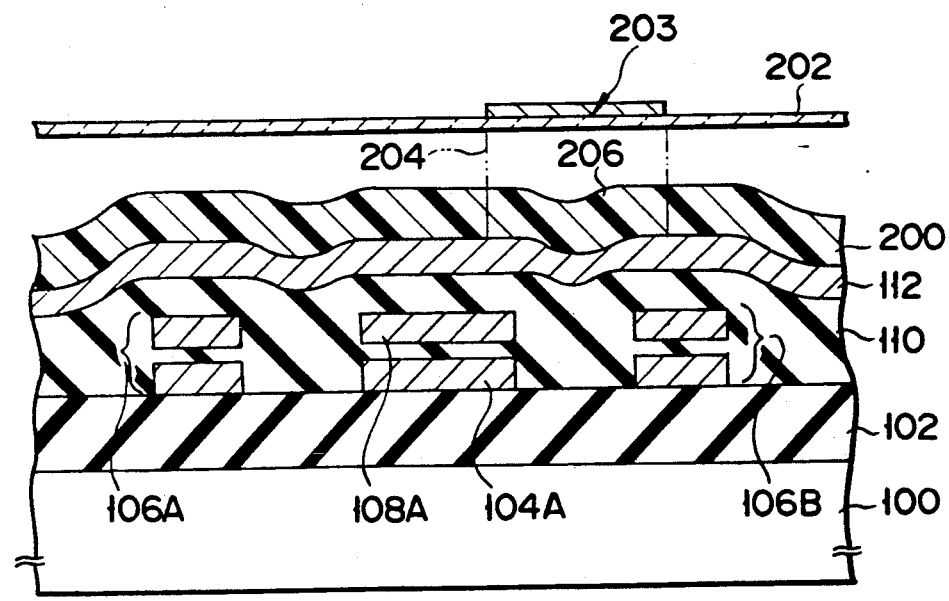
Figure 5B:
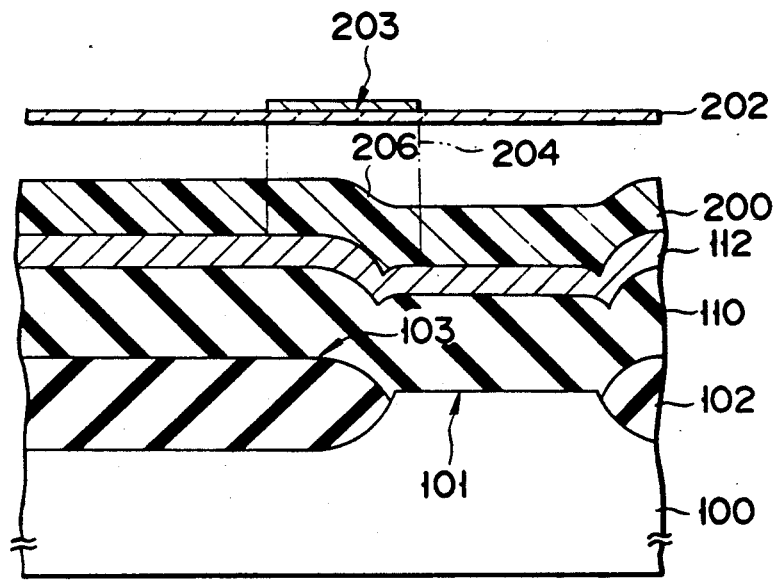

Therefore, as shown in FIGS. 4D and 5B, even when the exposure is progressed, the ultraviolet beam 204 reflected by an inclined surface of the recess portion of the upper surface 132 of the Al film 112 can be extremely prevented from giving an adverse effect to the accuracy of the exposed size of the photoresist 200. That is, as in the region 206, the light-shielding portion 203 having the widths P1 or P3 can be accurately copied to the photoresist 200 as a remaining portion.

Figure 5C:
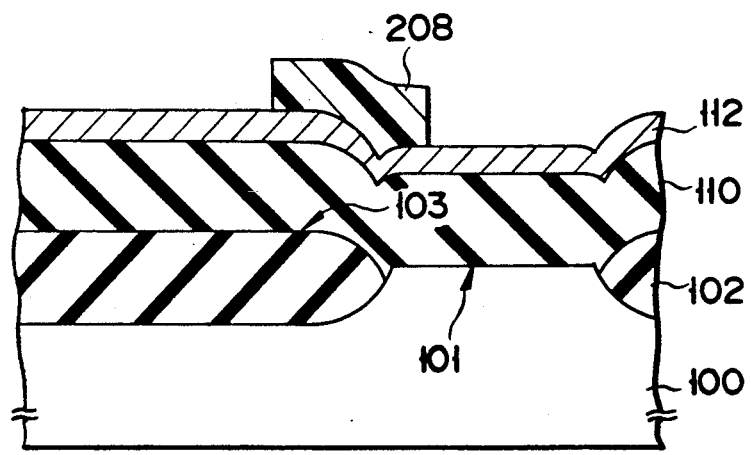

As described above, when the exposed photoresist 200 is developed, as shown in FIGS. 4E and 5C, a photoresist pattern 208 in which the pattern of the light-shielding portion 203 is strictly reproduced without decreasing the width due to the reflection of the ultraviolet beam 204 can be obtained. The Al layer 112 is then etched using the pattern 208 as a mask.

As described above, when the wiring layer is formed by etching, the wiring layer 150 having a predetermined width without any local narrow portion, as shown in FIGS. 1 to 3, can be obtained.

According to the method of manufacturing a semiconductor device with the arrangement described in FIGS. 1 to 5, even when the wiring layer 150 is formed to partially cover the step portion of the interlevel insulator 110, the wiring layer 150 is not narrowed. Therefore, for example, the wiring layer 150 is not discontinued when a surface protection film (not shown) is formed. Semiconductor devices can be manufactured at a high yield due to the structure of the devices. In addition since the wiring layer 150 is not locally narrowed, the quality of the wiring layer 150 is rarely degraded, and discontinuation of the wiring layer 150 in the use of the device can be prevented, thereby greatly prolonging the service life of the device.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device in which a metal wiring layer is formed by a positive photoresist on an interlevel insulator having a step portion on its surface, said metal wiring layer extending along said step portion in a longitudinal direction thereof and being formed across said step portion in a direction perpendicular to said longitudinal direction, and said method comprising the steps of:
   arranging a metal layer on a region on said interlevel insulator including said step portion;
   arranging said resist on said metal layer;
   exposing said resist to a light beam using mask means having a light-shielding portion corresponding to said wiring layer to pattern said resist; and
   etching said metal layer using said patterned resist as a mask;
   wherein said light-shielding portion of said mask means is sized such that both sides of said metal wiring layer are located at locations where an upper surface of said interlevel insulator is perpendicular to the radiation direction of the light beam.

2. A method according to claim 1, wherein said step portion is formed on a surface of said interlevel insulator by a electrode under said interlevel insulator.

3. A method according to claim 1, wherein said step portion is formed on the surface of said interlevel insulator by a lower wiring layer under said interlevel insulator.

4. A method according to claim 1, wherein said step portion is formed on the surface of said interlevel insulator by an interface portion between an element region and an element isolation region.

5. A method according to claim 1, wherein said step portion is part of a recess portion of the surface of said interlevel insulator.

6. A method according to claim 1, wherein said wiring layer is made of aluminum.

7. A method of manufacturing a semiconductor device in which a metal wiring layer is formed by a positive photoresist on an interlevel insulator having a recess portion on its surface, said metal wiring layer extending along said recess portion in a longitudinal direction thereof and being formed across said recess portion in a direction perpendicular to said longitudinal direction, and said method comprising the steps of:
   arranging a metal layer on a region on said interlevel insulator including said recess portion;
   arranging said resist on said metal layer;
   exposing said resist to a light beam using mask means having a light-shielding portion corresponding to said wiring layer to pattern said resist; and
   etching said metal layer using said patterned resist as a mask;
   wherein said light-shielding portion of said mask means is sized such that both sides of said metal wiring layer are located at locations where an upper surface of said interlevel insulator is perpendicular to the radiation direction of the light beam.

8. A method according to claim 7, wherein said recess portion is formed on a surface of said interlevel insulator corresponding to a position between two electrodes under said interlevel insulator.

9. A method according to claim 7, wherein said recess portion is formed on the surface of said interlevel insulator corresponding to a position between two lower wiring layers under said interlevel insulator.

10. A method of according to claim 7, wherein said wiring layer is made of aluminum.

* * * * *